(12) United States Patent
Mani et al.

(10) Patent No.: US 11,316,488 B2
(45) Date of Patent: *Apr. 26, 2022

(54) CONTROLLING ANALOGUE GAIN OF AN AUDIO SIGNAL USING DIGITAL GAIN ESTIMATION AND VOICE DETECTION

(71) Applicant: Imagination Technologies Limited, Kings Langley (GB)

(72) Inventors: Senthil Kumar Mani, Hyderabad (IN); Bala Manikya Prasad Puram, Hyderabad (IN)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,365

(22) Filed: Jun. 26, 2019

(65) Prior Publication Data
US 2019/0319598 A1 Oct. 17, 2019

Related U.S. Application Data

(63) Continuation of application No. 15/437,573, filed on Feb. 21, 2017, now Pat. No. 10,374,563.

(30) Foreign Application Priority Data

Feb. 19, 2016 (GB) ..................................... 1602915

(51) Int. Cl.
*H03G 3/30* (2006.01)
*H04M 9/08* (2006.01)
(52) U.S. Cl.
CPC ......... *H03G 3/3005* (2013.01); *H03G 3/3089* (2013.01); *H04M 9/082* (2013.01); *H04M 9/08* (2013.01)

(58) Field of Classification Search
CPC .............................. G10L 25/84; G10L 21/034
(Continued)

(56) References Cited

U.S. PATENT DOCUMENTS 5,838,269 A * 11/1998 Xie ........................ H03M 1/185
341/139
6,523,003 B1 * 2/2003 Chandran ............ G10L 21/0208
704/225
(Continued)

FOREIGN PATENT DOCUMENTS

| EP | 2608569 A1 | 6/2013 |
| WO | 99/30421 A1 | 6/1999 |
| WO | 02/32018 A2 | 4/2002 |

OTHER PUBLICATIONS

United Kingdom Combined Search and Examination Report dated Feb. 3, 2020, in corresponding United Kingdom Application No. 2000016.2.

*Primary Examiner* — Richemond Dorvil
*Assistant Examiner* — Rodrigo A Chavez
(74) *Attorney, Agent, or Firm* — Potomac Law Group, PLLC; Vincent M DeLuca

(57) ABSTRACT

A gain control system for controlling gain applied to an audio signal includes a power estimator configured to estimate the power of a digital signal derived from the audio signal, a digital gain estimator configured to determine, in dependence on the estimated power, a digital gain which would modify the power of the digital signal so as to reach a target power level, and a gain controller configured to adjust an analogue gain applied to the audio signal in dependence on the determined digital gain.

18 Claims, 3 Drawing Sheets

(58) Field of Classification Search
USPC .................................................. 704/225, 233
See application file for complete search history.

(56) References Cited

U.S. PATENT DOCUMENTS

| | | | |
|---|---|---|---|
| 6,591,234 B1 * | 7/2003 | Chandran | G10L 21/0208 704/225 |
| 8,275,610 B2 * | 9/2012 | Faller | H04S 3/008 704/225 |
| 8,275,611 B2 * | 9/2012 | Zong | G10L 21/02 704/225 |
| 10,374,563 B2 * | 8/2019 | Mani | H03G 3/3005 |
| 2002/0107593 A1 * | 8/2002 | Rabipour | H04L 29/06027 700/94 |
| 2003/0091180 A1 * | 5/2003 | Sorqvist | H04M 9/082 379/390.03 |
| 2006/0170787 A1 * | 8/2006 | Bentkovski | H04N 5/2354 348/222.1 |
| 2007/0064961 A1 * | 3/2007 | Jiang | H03G 3/3089 381/104 |
| 2007/0262819 A1 * | 11/2007 | Jin | H04M 1/6008 330/278 |
| 2008/0147393 A1 * | 6/2008 | Zhang | G10L 21/0208 704/233 |
| 2012/0143603 A1 | 6/2012 | Kim | |
| 2013/0024193 A1 * | 1/2013 | Yeldener | H03G 3/3005 704/225 |
| 2013/0144615 A1 * | 6/2013 | Rauhala | H03G 3/301 704/225 |
| 2015/0263686 A1 * | 9/2015 | Lesso | H03M 1/0626 341/144 |

* cited by examiner

CONTROLLING ANALOGUE GAIN OF AN AUDIO SIGNAL USING DIGITAL GAIN ESTIMATION AND VOICE DETECTION

CROSS-REFERENCE TO RELATED APPLICATIONS AND CLAIM OF PRIORITY

This is a continuation under 35 U.S.C. 120 of copending application Ser. No. 15/437,573 filed Feb. 21, 2017, which claims foreign priority under 35 U.S.C. 119 from United Kingdom Application No. 1602915.9 filed Feb. 19, 2016.

BACKGROUND OF THE INVENTION

This invention relates to controlling gain for a microphone signal.

In telephony, audio signals (e.g. including voice signals) are transmitted between a near-end and a far-end. In a bidirectional voice communication, the "near-end" and "far-end" are defined relative to each participant. Thus, the "near-end" for one participant will correspond to the "far-end" for the other participant. Far-end signals which are received at the near-end may be outputted from a loudspeaker at the near-end. A microphone at the near-end may be used to capture a near-end signal to be transmitted to the far-end, such as a voice of a participant at the near-end.

The quality of the audio outputted by the far-end loudspeaker may be affected by the amount of gain that is applied to the signal captured by the near-end microphone. For example, if the signal captured by the microphone has a high volume (e.g., which may be due to near-field speech caused by a person talking very close to the microphone) and a high gain is applied to that signal, then this may lead to signal saturation and so a poor quality signal is sent to the far-end. Whereas, if the signal captured has a low volume (e.g., which may be due to far-field speech caused by the person talking being far away from the microphone) and a low gain is applied, then this may lead to a low signal-to-noise ratio (SNR). Furthermore, a speech signal may change from far-field to near-field (and vice versa) as a person speaking moves towards or away from the microphone. This will affect the power (or amplitude) of the speech signal that is incident at the microphone and so the amount of gain that is applied to the signal will need to be appropriately adapted and the adaptation should be performed in a timely manner so as to maintain the quality of the signal sent to the far-end. Furthermore, changing the amount of gain applied can cause a degradation in the performance of other signal processing modules at the near-end device such as automatic speech recognition (ASR), echo cancellation, noise cancellation and speech enhancement. There is, therefore, also a need to mitigate such degradation.

BRIEF SUMMARY OF THE INVENTION

According to a first aspect of the present invention there is provided a gain control system for controlling gain applied to an audio signal, the system comprising: a power estimator configured to estimate the power of a digital signal derived from the audio signal; a digital gain estimator configured to determine, in dependence on the estimated power, a digital gain which would modify the power of the digital signal so as to reach a target power level; and a gain controller configured to adjust an analogue gain applied to the audio signal in dependence on the determined digital gain.

The audio signal may be a microphone signal.

The gain control system may further comprise a voice detector configured to detect a presence of voice in the digital signal, wherein the gain controller may be configured to adjust the analogue gain only if the presence of voice is detected.

The gain controller may be configured to reduce the gain applied to the audio signal if the presence of voice is detected and the estimated power is greater than the target power level.

The gain controller may be configured to increase the gain applied to the audio signal if the presence of voice is detected and the estimated signal power is less than the target power level.

The gain controller may be configured to perform the adjustment of the analogue gain in response to the voice detector subsequently detecting an absence of voice in the digital signal.

The gain controller may be configured to perform the adjustment of the analogue gain in response to subsequently detecting that the power of the digital signal is below a power threshold.

The estimated power may be an average power determined from a plurality of frames of the digital signal.

The gain controller may be configured to retrieve a value for the analogue gain that corresponds to the digital gain from a lookup table.

The gain controller may be configured to adjust the analogue gain applied to the audio signal from a current gain level to an adjusted gain level at an adjustment rate, the rate being determined in dependence on the power difference between the digital signal power and the target power level.

The adjustment rate may be variable and the gain controller may be configured to increase the adjustment rate in response to determining an increase in the power difference between the digital signal power and the target power level.

The adjustment rate may be variable and the gain controller may be configured to decrease the adjustment rate in response to determining a decrease in the power difference between the digital signal power and the target power level.

The adjustment rate may be determined in dependence on the current gain level or the adjusted gain level.

If the adjusted gain level is greater than the current gain level, the gain controller may be configured to determine a first adjustment rate and if the adjusted gain level is less than the current gain level, the gain controller may be configured to determine a second adjustment rate that is greater than the first adjustment rate.

The gain control system may further comprise an echo canceller configured to cancel echo from the audio signal, wherein the digital signal is an echo cancelled signal.

The digital gain estimator may be further configured to smooth the determined digital gain, the gain controller may be configured to adjust the analogue gain applied in dependence on the smoothed digital gain.

According to a second aspect of the present invention there is provided a method for controlling gain applied to an audio signal, the method comprising: estimating the power of a digital signal derived from the audio signal; determining, in dependence on the estimated power, a digital gain which would modify the power of the digital signal so as to reach a target power level; and adjusting an analogue gain applied to the audio signal in dependence on the determined digital gain.

The audio signal may be a microphone signal.

The method may further comprise detecting a presence of voice in the digital signal, wherein the analogue gain is adjusted only if the presence of voice is detected.

The adjusting step may comprise reducing the gain applied to the audio signal if the presence of voice is detected and the estimated power is greater than the target power level.

The adjusting step may comprise increasing the gain applied to the audio signal if the presence of voice is detected and the estimated signal power is less than the target power level.

The adjusting step may be performed in response to subsequently detecting the absence of voice in the digital signal.

The adjusting step may be performed in response to detecting that the power of the digital signal is below a power threshold.

The estimated power may be an average power determined from a plurality of frames of the digital signal.

The method may further comprise retrieving a value for the analogue gain that corresponds to the digital gain from a lookup table.

The analogue gain applied to the audio signal may be adjusted from a current gain level to an adjusted gain level at an adjustment rate, the rate being determined in dependence on the power difference between the digital signal power and the target power level.

The adjustment rate may be variable and the adjustment rate may be increased in response to determining an increase in the power difference between the digital signal power and the target power level.

The adjustment rate may be variable and the adjustment rate may be decreased in response to determining a decrease in the power difference between the digital signal power and the target power level.

The adjustment rate may be determined in dependence on the current gain level or the adjusted gain level.

If the adjusted gain level is greater than the current gain level, a first adjustment rate may be determined and if the adjusted gain level is less than the current gain level, a second adjustment rate may be determined that is greater than the first adjustment rate.

The method may further comprise cancelling echo from the audio signal, wherein the digital signal is an echo cancelled signal.

The method may further comprise smoothing the determined digital gain, the adjusted analogue gain being in dependence on the smoothed digital gain.

The gain control system described above may be embodied in hardware on an integrated circuit.

There is provided a method of manufacturing, at an integrated circuit manufacturing system, the gain control system described above.

There is provided an integrated circuit definition dataset that, when processed in an integrated circuit manufacturing system, configures the system to manufacture the gain control system described above.

According to a third aspect of the present invention there is provided a non-transitory computer readable storage medium having stored thereon a computer readable description of an integrated circuit that, when processed in an integrated circuit manufacturing system, causes the integrated circuit manufacturing system to manufacture the gain control system described above.

There is provided an integrated circuit manufacturing system comprising: a non-transitory computer readable storage medium having stored thereon a computer readable integrated circuit description that describes a gain control system; a layout processing system configured to process the integrated circuit description so as to generate a circuit layout description of an integrated circuit embodying the gain control system; and an integrated circuit generation system configured to manufacture the gain control system according to the circuit layout description, wherein the gain control system comprises: a power estimator configured to estimate the power of a digital signal derived from an audio signal; a digital gain estimator configured to determine, in dependence on the estimated power, a digital gain which would modify the power of the digital signal so as to reach a target power level; and a gain controller configured to adjust an analogue gain applied to the audio signal in dependence on the determined digital gain.

There is provided a computer program code for performing any of the methods described above.

There is provided a non-transitory computer readable storage medium having stored thereon computer readable instructions that, when executed at a computer system, cause the computer system to perform any of the methods described above.

BRIEF DESCRIPTION OF THE DRAWINGS

The present invention will now be described by way of example with reference to the accompanying drawings. In the drawings.

DETAILED DESCRIPTION OF THE INVENTION

The following description is presented by way of example to enable a person skilled in the art to make and use the invention. The present invention is not limited to the embodiments described herein and various modifications to the disclosed embodiments will be apparent to those skilled in the art.

Figure 1:
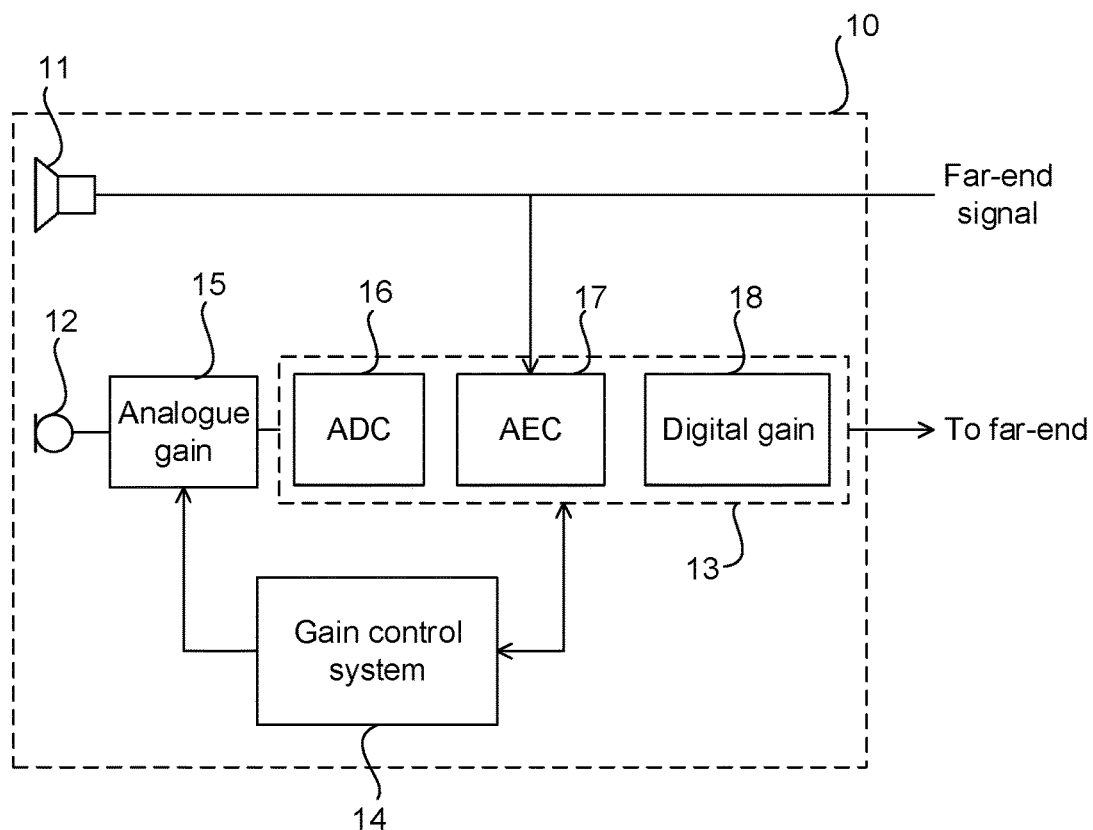
FIG. 1 shows an example of a communications device.

FIG. 1 shows an example of a communication device 10 comprising a loudspeaker 11, microphone 12, a signal processing section 13 and a gain control system 14. In an alternative arrangement (not shown), the loudspeaker 11 and microphone 12 may be external to the device 10 and connected to the device 10 via appropriate output and input ports. Examples of suitable communication devices 10 include mobile phones, smart phones, line connected phones, laptops, tablets, teleconferencing equipment etc. The communication device 10 may also include a CPU, memory, signal processing circuitry, such as a DSP and filters, etc. (none of which are shown in FIG. 1 for simplification of explanation). The communication device 10 may be used for communications over a network (such as the internet, LTE, etc) and comprise an appropriate network interface (not shown). The communications device 10 may be used for communications such as telephone calls, Voice over Internet Protocol (VoIP), teleconferencing, videoconferencing, etc.

The microphone 12 captures audio by converting sound into electrical signals, which are analogue signals. Gain is applied to the analogue signals from the microphone (also referred to herein as "microphone gain"), as depicted at analogue gain stage 15. In alternative implementations, the analogue signal may be from an audio source other than a microphone, such as tape, vinyl, etc. The analogue gain may be applied at the audio source (e.g., the microphone) and/or by an amplifier (not shown). The applied analogue gain may be, for example, an increase in the amplitude of the electrical signal. This can have the effect of increasing the amplitude of the captured sound. The amplified signal is provided to a signal processing section 13, which performs various signal processing functions so that the signal is suitable for transmission to the far-end. The signal processing functions may include, for example, converting the analogue signal into a digital signal (as depicted by analogue-to-digital converter (ADC) 16), echo cancellation (as depicted by acoustic echo canceller (AEC) 17 which also receives the far-end signal to perform the echo cancellation), encoding, packetising, etc.

Gain may also be applied, digitally, to the digital signal representing the audio from the microphone. This is depicted by digital gain stage 18. The digital gain may be applied to the digital signal, for example, during ADC conversion, as part of the encoding process or at any other suitable stage. The digital gain may be applied in accordance with a communications codecs like ITU-T Recommendation G.729, Adaptive Multi-Rate (AMR) NB, AMR WB, OPUS etc or standard such as Recommendation ITU-T G.169.

Figure 2:
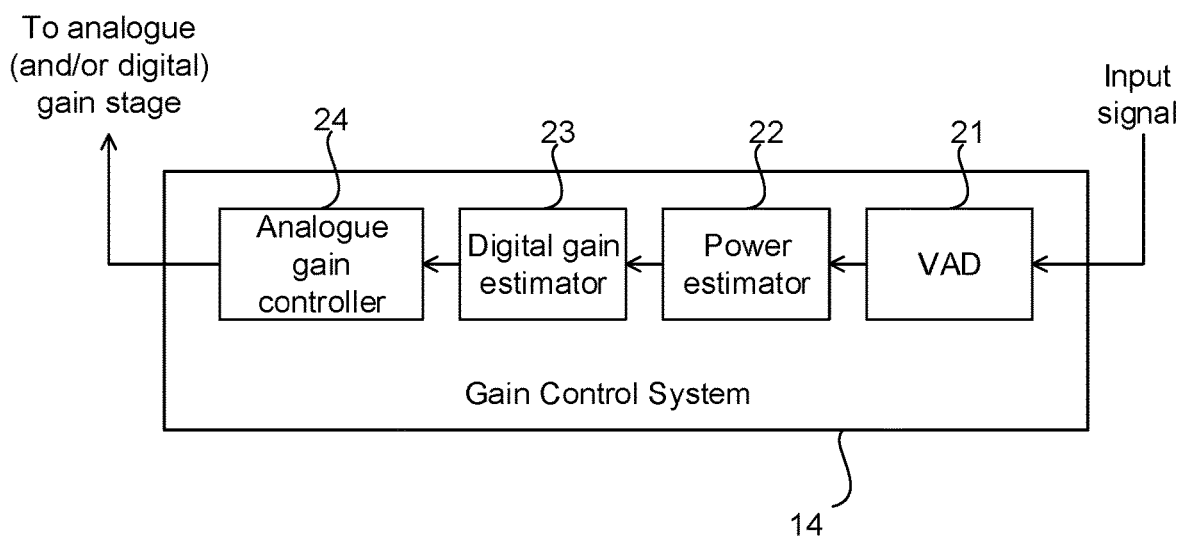
FIG. 2 shows an example of a gain control system.

The communication device 10 comprises a gain control system 14 (which is shown in further detail in FIG. 2). The amount of gain applied at the analogue gain stage 15 can be controlled by the gain control system 14. Optionally, the gain control system 14 may also control the amount of gain applied at the digital gain stage 18. As shown in FIG. 2, the gain control system 14 may comprise a voice activity detector (VAD) 21, a power estimator 22, a digital gain estimator 23 and an analogue gain controller 24, each of which may be implemented in hardware, software or a combination thereof.

The gain control system 14 receives, as an input signal, a signal from the signal processing section 13. The input signal received by the gain control system 14 is a digital signal that is derived from the audio signal captured by the microphone 12. The input signal received may be, for example, from an output at the end of the signal processing section 13 or from an intermediate stage of the signal processing section 13. For example, the input signal may be the audio signal from the microphone 12 that has been digitally converted (e.g. at ADC 16). This may be the case if device 10 is used for one way communication. Alternatively, the input signal could be an echo cancelled signal (e.g. from AEC 17). This may be the case if device 10 is used for duplex communication.

The input signal may be analysed at VAD 21 to determine if the signal contains any speech. The input signal may be provided as audio frames. Each audio frame may contain one or more samples of the audio signal from the microphone. The frames may be temporarily stored in memory (not shown), for example, for the purposes of filtering and smoothing (as described further below). Each frame may be classified as "speech" or "noise" by the VAD 21. The VAD 21 may then provide the speech frames to the power estimator 22 for further analysis. The noise frames may be ignored for any further analysis. VAD 21 may be any suitable voice activity detector known in the art. In an alternative embodiment, the input signal may instead be analysed to detect signals other than speech such as music, baby noises, animal noises, etc. In a further alternative, the VAD 21 may be omitted and all frames of the input signal are provided to the power estimator 22.

The power estimator 22 determines the audio signal power for the input signal. For example, where the input signal is provided as audio frames, the audio signal power may be determined for each received frame. Where a frame classified as a speech frame is received, the audio data contained within that frame may be assumed to be predominantly speech and thus the power estimator 22 can estimate the speech signal power for that frame. The power of the input signal is determined in the digital domain. The determined power of the digital input signal may therefore be representative of the power of the analogue audio signal provided to the signal processing section 13. The input signal power for each $l^{th}$ frame may be estimated according to the following equation:

$$p(l)=\hat{x}(l)*\hat{x}^T(l) \tag{1}$$

Where $\hat{x}(l)=x(l_1, l_2, \ldots, l_N)$ is the microphone samples vector, N is the frame size and l is the frame index (i.e. each $l^{th}$ frame contains N samples).

The signal power p(l) may be smoothed and averaged to account for any spurious low or high level speech spurts or samples. The signal power may be smoothed, for example, by using a suitable first order low pass filter and a suitable averaging factor. The signal power determined for each $l^{th}$ frame of the input signal may be smoothed using the signal power determined for one or more previously received frames (e.g. using p(l−1), p(l−2), etc power values).

The estimated power may then be provided to the digital gain estimator 23. The digital gain estimator 23 estimates a digital gain which would, if applied to the input signal, modify the power of the input signal so as to reach a target power level. The target power level may be a power level that is set by, for example, an application that is managing communications for device 10, by the codec used for the communication, by a user, etc. The target level may be a predefined constant level (e.g. around −6 dB) or variable.

The power estimator 22 may estimate p(l) by squaring the input signal amplitude and averaging it or passing it through a low pass filter. Thus, to calculate the power difference between the power of the input signal and the target power level, p(l) would need to be square rooted. The gain g(l) required for the input signal to reach the target level may be estimated as:

$$g(l) = \frac{P_T(l)}{\sqrt{p(l)}} \tag{2}$$

Where $P_T(l)$ is the target power level and p(l) is the signal power estimated by the power estimator 22. The target power level $P_T(l)$ may be a constant or may vary depending on the implementation.

The gain g(l) may be smoothed, for example, by a suitable first order low pass filter and a suitable averaging factor. The gain g(l) may be smoothed using one or more gain values that have been determined previously (e.g. using g(l−1), g(l−2), etc values). Smoothing of the signal power and/or gain helps avoid natural variations and fluctuations of human speech from affecting the determined power and gain levels.

Smoothing of the gain may be performed at multiple levels. For example, the gain g(l) may be smoothed using first order low pass filter using a smoothing factor α to determine a smoothed gain value G(l):

$$G(l)=G(l-1)+\alpha(g(l)-G(l-1)) \tag{3}$$

The smoothed gain may be smoothed further, for example, a further three times, as shown below:

$$G_{s1}(l)=G_{s1}(l-1)+\alpha_1(G(l)-G_{s1}(l-1)) \tag{4}$$

$$G_{s2}(l)=G_{s2}(l-1)+\alpha_2(G_{s1}(l)-G_{s2}(l-1)) \quad (5)$$

$$G_{s3}(l)=G_{s3}(l-1)+\alpha_3(G_{s2}(l)-G_{s3}(l-1)) \quad (6)$$

$$G_a(l)=G_{s3}(l) \quad (7)$$

Where $G_a(l)$ is a smoothed version of the gain value required for the signal to reach the target level, $\alpha_1, \alpha_2, \alpha_3$ are predetermined smoothing factors, where each of which may differ depending on whether a gain increase or decrease is required. Smoothing the gain multiple times in this way helps avoid natural variations in human speech inducing variation in the gain estimation.

The analogue gain controller 24 may adjust the analogue gain for the microphone signal based on the estimated gain g(l) (or its smoothed/averaged value e.g., G(l) or $G_a(l)$). If the power level of the signal is equal to the target power level (which, for example, may be indicated by gain g(l) being one), then no adaption of the microphone gain will be required. If the power level of the signal is less than the target power level (which, for example, may be indicated by gain g(l) being greater than one), then the microphone gain may be increased. If the power level of the signal is greater than the target power level (which, for example, may be indicated by gain g(l) being less than one), then the microphone gain may be decreased. The amount of increase or decrease of the microphone gain may be determined based the difference between the signal power level and the target power level. This difference may be indicated by gain g(l). In one example, the analogue gain controller 24 may access a lookup table (which may be stored in memory) which maps digital gain g(l) values to analogue gain values for the microphone. The analogue gain controller 24 may retrieve analogue microphone gain values from the lookup table based on the determined gain g(l) and increase or decrease the microphone gain by the looked up value.

The analogue gain controller 24 may determine a rate or time instant for adapting the microphone gain. Changes to the microphone gain cause the echo path or the noise floor to change which may affect the performance of other speech enhancement modules like AEC 17, a noise canceller (not shown), etc. Generally, the speech enhancement modules are more adversely affected by an increase in the microphone gain than a reduction in the microphone gain. Thus, in one example, the gain controller 24 may adapt the microphone gain less frequently for increases in the microphone gain than for reductions in the microphone gain. In another example, the adverse effects of gain increases may be reduced by applying the gain changes (such as an increase) during periods of silence. The analogue gain controller 24 may determine an amount of gain increase and wait for a silent period before applying the change in gain. For example, if VAD 21 detects a series of frames that do not contain speech, it may be inferred that there is currently a silent period and so the analogue gain controller 24 applies the gain change. A silent period could also be determined by measuring the signal power (e.g. using the power estimator 22, as described above) and determining when the signal power is very low. The signal power could be considered to be very low if the power falls below a threshold power level which could be regarded as, for example, merely background noise. The threshold power level could be set to be, for example, the minimum power level required to detect voice by VAD 21. When the signal power is determined to be below the threshold, the gain controller 24 may apply the microphone gain increase.

Increases in the microphone gain to be applied at any instant in time may be limited to a pre-defined value (e.g. ~3 dB) so that the speech enhancement modules are able to re-adapt to the new levels quickly.

The gain controller 24 may adjust the digital gain applied at the digital gain stage 18 based on the determined gain g(l). The digital gain adjustment may be in addition to or alternative to the analogue gain adjustment. The digital gain adjustment may be made when, for example, it is not possible to adjust the analogue gain (because, for example, the adjustment would cause the analogue gain to be outside of a working range).

Figure 3:
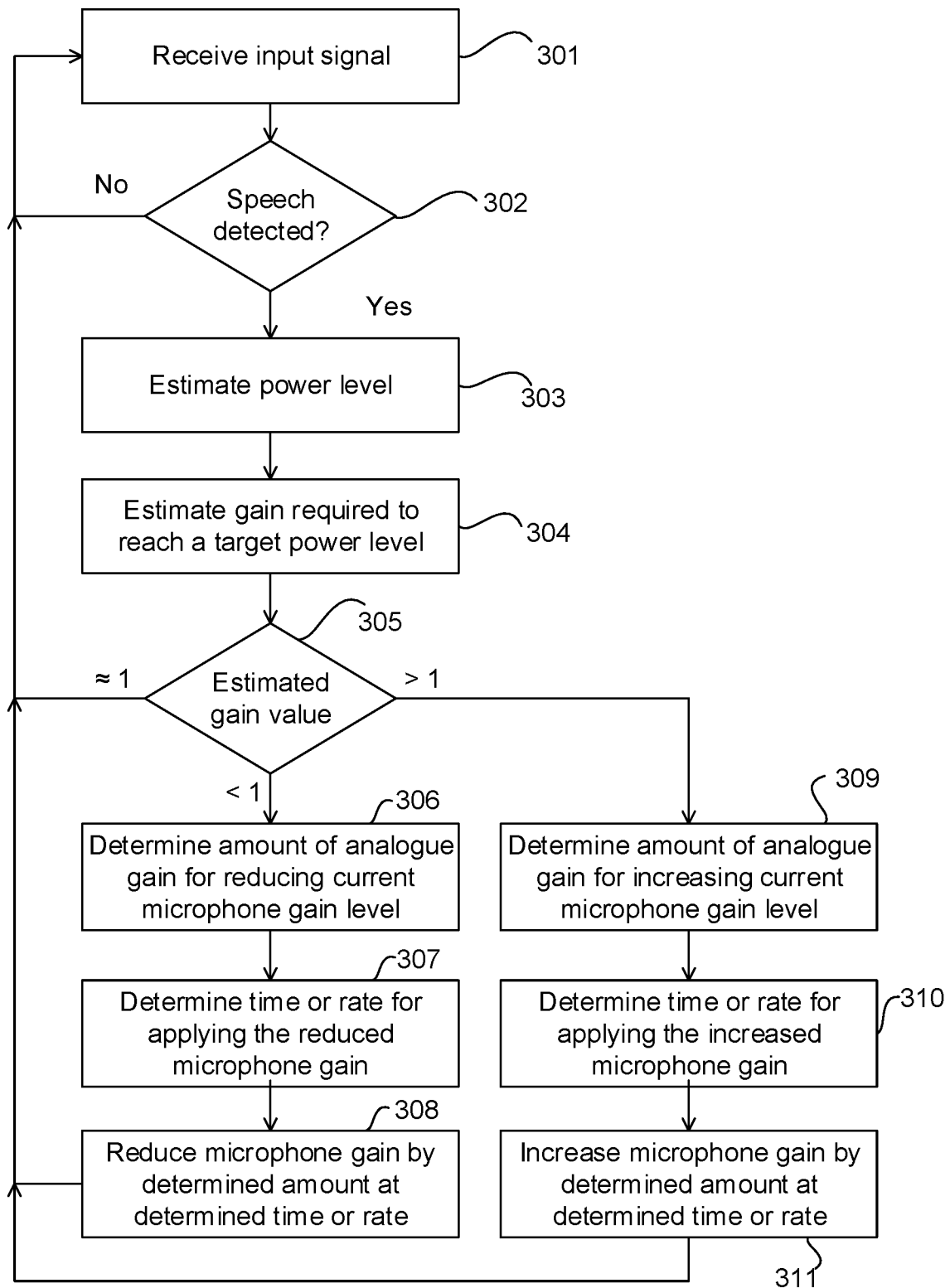
FIG. 3 shows an example process for controlling gain.

FIG. 3 is a flow diagram which illustrates an example of how the microphone gain may be adapted. At 301, an input signal is received at the gain control system 14. As mentioned above, the input signal may be the digitised microphone signal or a processed version of the microphone signal (e.g. processed by the AEC 17). In this example, the input signal is the microphone signal that has been digitised, encoded and framed according to a media codec.

At 302, a received frame is analysed to determine if there is any speech present in that frame. This analysis may be performed by the VAD 21, as described above. If speech is detected, the frame is classified as "speech" and the process moves on to step 303. If there is no speech detected, the process moves back to step 301 to receive the next frame and no changes are made to the microphone gain.

At step 303, the power of the audio signal for the frame (that contains speech) is estimated. This estimation may be performed by the power estimator 22, as described above. The estimated power may be smoothed and averaged using signal powers that have been estimated for previous frames. At step 304, the amount of gain, g(l), required for the audio signal to reach a target power level is determined. This determination may be performed by the digital gain estimator 23 and is determined based on the estimated power level, p(l), as described above.

At step 305, it is determined if gain g(l) is greater than one, less than one or equal to one. If the determined gain is one, then this indicates that the estimated power level, p(l), is equal to the target power level and so no adaption of the microphone gain is required and so the process moves back to step 301 to receive the next frame without changing the microphone gain. If gain g(l) is less than one, the process moves on to step 306. If the gain g(l) is greater than one, the process moves on to step 309.

At step 306, gain g(l) is less than one, which indicates that the signal power is greater than the target power level and so the microphone gain needs to be reduced. The amount of analogue gain for adjusting the current microphone gain is determined based on digital gain g(l). For example, an analogue gain value may be determined for digital gain g(l) from a lookup table, as described above. Alternatively, the digital gain g(l) value may be further processed prior to the lookup using the following equation to determine an amount of gain reduction $G_{red}$ (see equation 8). A current gain value may then be reduced by the gain reduction value $G_{red}$ to provide a new gain $G_{new}$. An analogue gain value may then be looked up from the new gain value $G_{new}$.

$$G_{red}(l) = -\mu_r * \frac{\exp(\zeta) + \exp(-\zeta)}{G(l-1)} \quad (8)$$

Where $$\zeta = \min\left(\frac{1}{g(l)}, G_{max}\right),$$

$\mu_r$ is a constant, g(l) is the amount of digital gain that has been determined at step 304 and $G_{max}$ is predefined maximum change in the gain value.

At step 307, a rate or time instant for reducing the microphone gain is determined. The rate or time instant may be determined based on the determined amount of analogue gain at step 306 or digital gain g(l) at step 305. For example, the microphone gain may be reduced quickly if the signal power is very high to help avoid distortion due to saturation as well as loud and inconvenient audio for the listener at the far-end. For example, if g(l)≤0.2, then this indicates high signal power and so the microphone signal may be adapted quickly. Whereas if 0.2≤g(l)≤1, then the adaption may be slower. For example, if g(l)≤0.2, then the microphone gain may be adapted instantly or after waiting for a short amount of time T (e.g. T=0.1 seconds). If 0.2≤g(l)≤1, then the microphone gain may be adapted according to:

$$T = \frac{\exp\left(\frac{-1}{g(l)} + 1 + \log(T_{max})\right)}{T_{max}} \tag{9}$$

Where T is the amount of time to wait before adapting the microphone gain and $T_{max}$, is a maximum amount of time to wait (e.g. 8 seconds). According to equation 9, as g(l) gets closer to 1, the amount of waiting time is increased. This has the effect of reducing the adaptation rate as the signal power level gets closer to the target power level.

The next adaptation instant or the waiting duration for applying the microphone gain change may also be dependent on the current analogue microphone gain level. For example, if the current microphone gain is high, the microphone gain reduction may be applied quickly because the high signal power captured may degrade the performance of speech enhancement modules, as mentioned above. Whereas, if the current microphone gain is low, the microphone gain reduction may be applied slowly because reducing the microphone gain to an even lower level may cause it to not capture the required audio.

Step 307 may be performed by the gain controller 24.

At step 308, the microphone gain is reduced by the amount of gain determined at step 306. The gain may be reduced at a rate or time determined at step 307. Alternatively, step 307 may be omitted and the microphone gain is reduced instantly after step 306. The process then returns to step 301 to receive the next frame.

At step 305, if gain g(l) is greater than one, the process moves on to step 309. At step 309, gain g(l) is greater than one, which indicates that the signal power is less than the target power level and so the microphone gain needs to be increased. The amount of analogue gain for adjusting the current microphone gain is determined based on digital gain g(l). For example, an analogue gain value may be determined for digital gain g(l) from a lookup table, as described above. Alternatively, the digital gain g(l) value may be further processed prior to the lookup using the following equation to determine an amount of gain increase $G_{inc}$ (see equation 10). A current gain value may then be increased by the gain increase value $G_{inc}$ to provide a new gain $G_{new}$. An analogue gain value may then be looked up from the new gain value $G_{new}$.

$$G_{inc}(l) = -\mu_i * \frac{\exp(\xi) + \exp(-\xi)}{G(l-1)} \tag{10}$$

Where $\xi = \min(g(l), G_{max})$, $\mu_i$ is a constant, g(l) is the amount of digital gain that has been determined at step 304 and $G_{max}$ is predefined maximum change in the gain value.

At step 310, a rate or time instant for increasing the microphone gain is determined. The rate or time instant may be determined based on the determined amount of analogue gain at step 309 or digital gain g(l) at step 305. For example, the amount of time to wait before increasing the microphone gain may be determined according to equation 11:

$$T = \frac{\exp\left(\frac{\log(T_{max})}{g(l)}\right)}{T_{max}} \tag{11}$$

Where T is the amount of time to wait before adapting the microphone gain and $T_{max}$, is a maximum amount of time to wait (e.g. 8 seconds). According to equation 11, as g(l) gets closer to 1, the amount of waiting time is increased. This has the effect of reducing the adaptation rate as the signal power level gets closer to the target power level. It also means that if the speech power level is low, the microphone gain is increased quickly so that the speech can be captured at a better level (i.e. nearer the target level) for the far-end listener.

The next adaptation instant or waiting duration for applying the microphone gain change may also be dependent on the current analogue microphone gain level. For example, when the current microphone gain is high, the time duration for applying the microphone gain increase may be large so that the gain is increased at a slow rate. This can help avoid signal saturation. When the current microphone gain is low, the time duration for applying the microphone gain increase may be at a fast rate as a low microphone gain may cause the signal to not be captured and so a quick increase in the microphone gain helps ensure that the required signal is captured.

Step 310 may be performed by the gain controller 24.

The system may provide a minimum amount of time to wait between gain adaptions, $T_{min}$ (e.g. 1 or 2 seconds), which may be predefined to ensure that the microphone gain is not adapted too rapidly. A maximum amount of time to wait between gain adaptations, $T_{max}$ (e.g. 8 seconds) may also be predefined. Furthermore, a maximum change in the amount of gain $G_{max}$ may also be predefined to help prevent large increases or decreases in the amount of gain at each adaptation step, which could cause the system to destabilise. Thus, the amount of time between gain adaptations determined at steps 307 and/or 310 may be bounded by $T_{min}$ and $T_{max}$ and the amount that the gain is adapted may be limited by $G_{max}$.

At step 311, the microphone gain is increased by the amount of gain determined at step 309. The gain may be increased at a rate or time determined at step 310. Alternatively, step 310 may be omitted and the microphone gain is increased instantly after step 309. The process then returns to step 301 to receive the next frame.

As well as adapting the analogue gain of the microphone signal, the digital gain applied (e.g. at digital gain stage 18) may also be adapted. The combination of adapting the analogue gain and the digital gain allows the dynamic range for the total gain to be larger.

As described above, the gain control system 14 helps to improve the quality of audio that is received by the far-end listener. In particular, the audio captured by a microphone is analysed in the digital domain to determine the power level of the audio and the amount of gain required for the power level of the audio to be at a target power level (which may correspond to an ideal power level for listening at the far-end). Performance of this analysis in the digital domain rather than in the analogue domain has a number of advantages such as: (i) the ability to analyse specific targeted audio such as speech only; (ii) the power of the signal may change as it is processed along the signal processing pipeline and so determining the power further down the pipeline (rather than at the input of the pipeline—as would be the case in the analogue domain) may provide a better indication of the signal power received by the far-end. Furthermore, it is advantageous to adapt the gain in the analogue domain rather than solely in the digital domain as there may be a loss in the resolution of the signal when multiplying the digitised values of the digital signal to apply the digital gain.

It is also advantageous to determine a difference between a current power level and a target power level and adapt the gain accordingly. Determining this difference allows the gain to be adapted quickly or slowly depending on if the difference is large or small respectively. This may be beneficial over set incremental increases or decreases as it allows the device to quickly adapt so that it can capture the required signal or remove distortions rapidly. It also allows aids system stability and the performance of other audio enhancement modules as the adaptation rate can be slowed down if the signal power level is close to the target power level, thus advantageously reducing the frequency at which the analogue gain is modified, as described above. Furthermore, reducing the adaptation frequency allows more time for an average power estimation to be carried out, which helps to provide a more accurate estimation.

The device and system of FIGS. 1 and 2 are shown as comprising a number of functional blocks. This is schematic only and is not intended to define a strict division between different logic elements of such entities. Each functional block may be provided in any suitable manner. It is to be understood that intermediate values described herein as being formed by a gain control system need not be physically generated by the gain control system at any point and may merely represent logical values which conveniently describe the processing performed by the gain control system between its input and output.

Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a gain control system configured to perform any of the methods described herein, or to manufacture a gain control system comprising any apparatus described herein. An integrated circuit definition dataset may be, for example, an integrated circuit description.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a gain control system will now be described with respect to FIG. 4.

Figure 4:
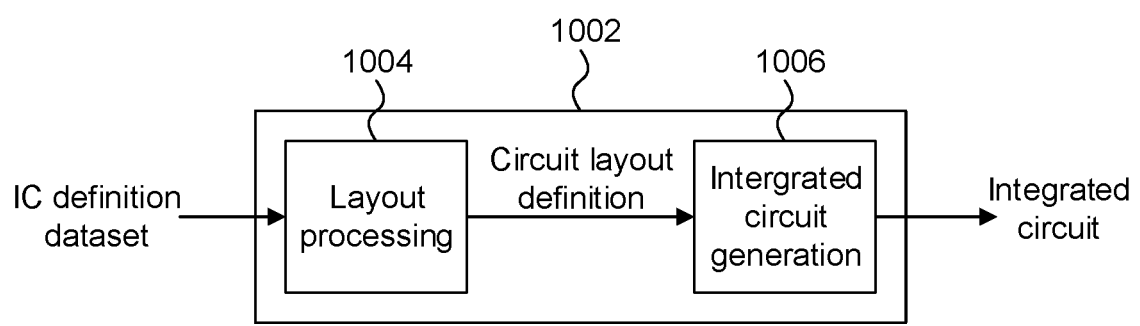
FIG. 4 is a schematic diagram of an integrated circuit manufacturing system.

FIG. 4 shows an example of an integrated circuit (IC) manufacturing system 1002 which comprises a layout processing system 1004 and an integrated circuit generation system 1006. The IC manufacturing system 1002 is configured to receive an IC definition dataset (e.g. defining a gain control system as described in any of the examples herein), process the IC definition dataset, and generate an IC according to the IC definition dataset (e.g. which embodies a gain control system as described in any of the examples herein). The processing of the IC definition dataset configures the IC manufacturing system 1002 to manufacture an integrated circuit embodying a gain control system as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a gain control system without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 4 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 4, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A gain control system for controlling gain applied to an audio signal, the system comprising:
   a power estimator configured to estimate the power of a digital signal derived from the audio signal;
   a digital gain estimator configured to determine, in dependence on the estimated power, a digital gain which would modify the power of the digital signal so as to reach a target power level;
   a voice detector configured to detect a presence of voice in the digital signal; and
   a gain controller configured to, in response to the voice detector detecting the presence of voice and subsequently detecting an absence of voice in the digital signal, adjust an analogue gain applied to the audio signal in dependence on the determined digital gain.

2. The gain control system as claimed in claim 1, wherein the audio signal is a microphone signal.

3. The gain control system as claimed in claim 1, wherein the gain controller is configured to reduce the gain applied to the audio signal if the presence of voice is detected and the estimated power is greater than the target power level or to increase the gain applied to the audio signal if the presence of voice is detected and the estimated signal power is less than the target power level.

4. The gain control system as claimed in claim 1, wherein the gain controller is configured to perform the adjustment of the analogue gain in response to subsequently detecting that the power of the digital signal is below a power threshold.

5. The gain control system as claimed in claim 1, wherein the estimated power is an average power determined from a plurality of frames of the digital signal.

6. The gain control system as claimed in claim 1, wherein the gain controller is configured to retrieve a value for the analogue gain that corresponds to the digital gain from a lookup table.

7. The gain control system as claimed in claim 1, wherein the gain controller is configured to adjust the analogue gain applied to the audio signal from a current gain level to an adjusted gain level at an adjustment rate, the rate being determined in dependence on the power difference between the digital signal power and the target power level.

8. The gain control system as claimed in claim 7, wherein the adjustment rate is variable and the gain controller is configured to increase the adjustment rate in response to determining an increase in the power difference between the digital signal power and the target power level.

9. The gain control system as claimed in claim 7, wherein the adjustment rate is variable and the gain controller is configured to decrease the adjustment rate in response to determining a decrease in the power difference between the digital signal power and the target power level.

10. The gain control system as claimed in claim 7, wherein the adjustment rate is determined in dependence on the current gain level or the adjusted gain level.

11. The gain control system as claimed in claim 7, wherein if the adjusted gain level is greater than the current gain level, the gain controller is configured to determine a first adjustment rate and if the adjusted gain level is less than the current gain level, the gain controller is configured to determine a second adjustment rate that is greater than the first adjustment rate.

12. The gain control system as claimed in claim 1, further comprising an echo canceller configured to cancel echo from the audio signal, wherein the digital signal is an echo cancelled signal.

13. The gain control system as claimed in claim 1, wherein the digital gain estimator is further configured to smooth the determined digital gain, the gain controller being configured to adjust the analogue gain applied in dependence on the smoothed digital gain.

14. A method for controlling gain applied to an audio signal, the method comprising:
estimating the power of a digital signal derived from the audio signal;
determining, in dependence on the estimated power, a digital gain which would modify the power of the digital signal so as to reach a target power level;
detecting a presence of a voice in the digital signal; and
in response to detecting the presence of voice and subsequently detecting an absence of voice in the digital signal, adjusting an analogue gain applied to the audio signal in dependence on the determined digital gain.

15. The method as claimed in claim 14, wherein adjusting comprises reducing the gain applied to the audio signal if the presence of voice is detected and the estimated power is greater than the target power level or increasing the gain applied to the audio signal if the presence of voice is detected and the estimated signal power is less than the target power level.

16. The method as claimed in claim 14, wherein the analogue gain applied to the audio signal is adjusted from a current gain level to an adjusted gain level at an adjustment rate, the rate being determined in dependence on the power difference between the digital signal power and the target power level.

17. The method as claimed in claim 16, wherein the adjustment rate is variable and the adjustment rate is increased in response to determining an increase in the power difference between the digital signal power and the target power level or the adjustment rate is decreased in response to determining a decrease in the power difference between the digital signal power and the target power level.

18. A non-transitory computer readable storage medium having stored thereon a computer readable dataset description of an integrated circuit that, when processed in an integrated circuit manufacturing system, causes the integrated circuit manufacturing system to manufacture a gain control system for controlling gain applied to an audio signal wherein the gain control system is embodied in hardware on an integrated circuit, the system comprising:
a power estimator configured to estimate the power of a digital signal derived from the audio signal;
a digital gain estimator configured to determine, in dependence on the estimated power, a digital gain which would modify the power of the digital signal so as to reach a target power level;
a voice detector configured to detect a presence of voice in the digital signal; and
a gain controller configured to, in response to the voice detector detecting the presence of voice and subsequently detecting an absence of voice in the digital signal, adjust an analogue gain applied to the audio signal in dependence on the determined digital gain.

* * * * *